(12) United States Patent
Hsu et al.

(10) Patent No.: US 11,793,095 B2
(45) Date of Patent: Oct. 17, 2023

(54) RESISTIVE RANDOM ACCESS MEMORY AND METHOD OF FABRICATING THE SAME

(71) Applicant: Winbond Electronics Corp., Taichung (TW)

(72) Inventors: Po-Yen Hsu, Taichung (TW); Bo-Lun Wu, Taichung (TW); Shih-Ning Tsai, Taichung (TW); Tse-Mian Kuo, Taichung (TW)

(73) Assignee: Winbond Electronics Corp., Taichung (TW)

( * ) Notice: Subject to any disclaimer, the term of this patent is extended or adjusted under 35 U.S.C. 154(b) by 234 days.

(21) Appl. No.: 17/392,268

(22) Filed: Aug. 3, 2021

(65) Prior Publication Data
US 2022/0216401 A1 Jul. 7, 2022

(30) Foreign Application Priority Data
Jan. 6, 2021 (TW) ................................. 110100451

(51) Int. Cl.
*H10N 70/00* (2023.01)
*H10B 63/00* (2023.01)
*H10N 70/20* (2023.01)

(52) U.S. Cl.
CPC ........... *H10N 70/841* (2023.02); *H10B 63/80* (2023.02); *H10N 70/021* (2023.02); *H10N 70/063* (2023.02); *H10N 70/24* (2023.02); *H10N 70/826* (2023.02); *H10N 70/8833* (2023.02)

(58) Field of Classification Search
CPC .. H10N 70/841; H10N 70/021; H10N 70/063; H10N 70/24; H10N 70/826; H10N 70/8833; H10N 70/8416; H10B 63/80
USPC .................................................. 365/148, 158
See application file for complete search history.

(56) References Cited

U.S. PATENT DOCUMENTS

| 10,497,865 | B2 | 12/2019 | Chen | |
|---|---|---|---|---|
| 2009/0174519 | A1* | 7/2009 | Mikawa | H10N 70/8833 338/20 |
| 2010/0176365 | A1* | 7/2010 | Park | H10B 63/80 257/42 |
| 2011/0155989 | A1* | 6/2011 | Park | H10N 70/884 438/102 |
| 2012/0063201 | A1* | 3/2012 | Hayakawa | H10N 70/063 257/E21.645 |
| 2013/0075686 | A1* | 3/2013 | Kawasaki | H10N 70/884 257/E45.001 |

(Continued)

FOREIGN PATENT DOCUMENTS

EP 3932855 A1 * 1/2022 ......... H01L 27/2454

*Primary Examiner* — Michael T Tran
(74) *Attorney, Agent, or Firm* — JCIPRNET

(57) ABSTRACT

A resistive random access memory, including a first electrode layer and a second electrode layer disposed opposite to each other, a variable resistance layer located between the first electrode layer and the second electrode layer, an oxygen exchange layer located between the variable resistance layer and the second electrode layer, a vacancy-supplying layer surrounding a middle sidewall of the oxygen exchange layer; and a vacancy-driving electrode layer located on the vacancy-supply layer and surrounding an upper sidewall of the oxygen exchange layer, is provided. A method of fabricating the resistive random access memory is also provided.

11 Claims, 4 Drawing Sheets

(56) References Cited

U.S. PATENT DOCUMENTS

| | | | |
|---|---|---|---|
| 2014/0110659 A1* | 4/2014 | Murase | H10N 70/24 |
| | | | 257/4 |
| 2014/0113430 A1* | 4/2014 | Hayakawa | H10N 70/041 |
| | | | 438/385 |
| 2015/0316958 A1* | 11/2015 | Takesue | G06F 3/0445 |
| | | | 345/173 |
| 2017/0279041 A1 | 9/2017 | Chen | |
| 2019/0165266 A1* | 5/2019 | Trinh | H10N 70/24 |
| 2020/0235294 A1* | 7/2020 | Fompeyrine | G11C 11/2277 |
| 2021/0074825 A1* | 3/2021 | Sharma | H01L 29/872 |
| 2021/0202835 A1* | 7/2021 | Han | H10N 70/8825 |
| 2021/0265565 A1* | 8/2021 | Hayakawa | H10N 70/823 |
| 2022/0085427 A1* | 3/2022 | Tajima | H01M 10/486 |
| 2022/0199783 A1* | 6/2022 | Penumatcha | H10B 63/30 |
| 2022/0310148 A1* | 9/2022 | Ikeda | G11C 7/16 |
| 2023/0028701 A1* | 1/2023 | Chen | H10N 70/8836 |

\* cited by examiner ns, vacancy-supplying layer surrounding a middle sidewall of the oxygen exchange layer, and a vacancy-driving electrode layer located on the vacancy-supply layer and surrounding an upper sidewall of the oxygen exchange layer.

RESISTIVE RANDOM ACCESS MEMORY AND METHOD OF FABRICATING THE SAME

CROSS-REFERENCE TO RELATED APPLICATION

This application claims the priority benefit of Taiwan application serial no. 110100451, filed on Jan. 6, 2021. The entirety of the above-mentioned patent application is hereby incorporated by reference herein and made a part of this specification.

BACKGROUND

Technical Field

This disclosure relates to a memory and a method of fabricating the same, and in particular to a resistive random access memory (RRAM) and a method of fabricating the same.

Description of Related Art

A resistive random access memory (RRAM) has advantages of fast operational speed, low power consumption, etc., so it has become a non-volatile memory that has been widely studied in recent years. A positive voltage is applied to the RRAM when it is performing a SET operation. Oxygen ions in a variable resistance layer will enter an oxygen exchange layer after being attracted by the positive voltage to leave the variable resistance layer. The variable resistance layer generates oxygen vacancies, forms filaments, and presents a conductive state. At this time, the variable resistance layer converts from a high resistance state (HRS) to a low resistance state (LRS). A negative bias voltage is applied to the RRAM when a RRAM unit 10 performs a RESET operation, and the oxygen ions in the oxygen exchange layer return to the variable resistance layer, causing the filaments to break and presenting a non-conductive state. At this time, the variable resistance layer converts from LRS to HRS. However, when the oxygen vacancies generated in the variable resistance layer are insufficient, a current in the low resistance state (LRS) will be insufficient too. In addition, some of the filaments in the variable resistance layer are likely to be damaged in the subsequent baking process, causing the resistive random access memory to have insufficient current during operation. Applying a higher operating voltage to the resistive random access memory may drive more oxygen vacancies, but it will cause greater power consumption.

SUMMARY

This disclosure provides a resistive random access memory and a method of fabricating the same, which may enable the resistive random access memory to have sufficient current and prevent an excessively large operating voltage being used, so as to reduce power consumption.

An embodiment of the disclosure provides a resistive random access memory including a first electrode layer and a second electrode layer disposed opposite to each other, a variable resistance layer located between the first electrode layer and the second electrode layer, an oxygen exchange layer located between the variable resistance layer and the second electrode layer, a vacancy-supplying layer surrounding a middle sidewall of the oxygen exchange layer, and a vacancy-driving electrode layer located on the vacancy-supply layer and surrounding an upper sidewall of the oxygen exchange layer.

An embodiment of the disclosure also provides a method of fabricating a resistive random access memory, which includes the following steps. A variable resistance layer is formed on the first electrode layer. A vacancy-supply layer is formed on the variable resistance layer. A vacancy-driving electrode layer is formed on the vacancy-supply layer. A first opening is formed in the vacancy-driving electrode layer. A first oxygen barrier layer is formed in the first opening. A second opening is formed in the first oxygen barrier layer and the vacancy-supply layer. An oxygen exchange layer is formed in the second opening. A second oxygen barrier layer is formed on the vacancy-driving electrode layer and the oxygen exchange layer. And, a second electrode layer is formed on the second oxygen barrier layer.

Based on the above, the disclosure provides a resistive random access memory and a method of fabricating the same. Oxygen vacancies may be increased by the disposition of the vacancy-driving electrode layer and the vacancy-supply layer, to enable the resistive random access memory to have sufficient current and prevent an excessively large operating voltage being used, so as to reduce power consumption.

DESCRIPTION OF THE EMBODIMENTS

Figure 1A:
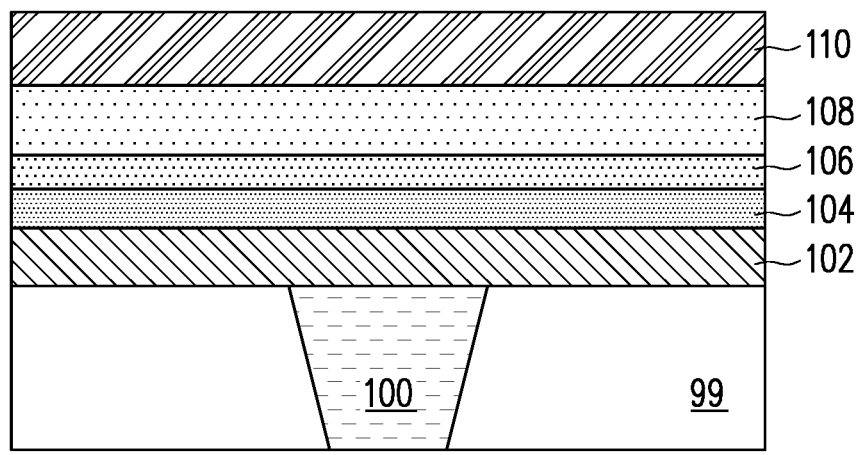
FIGS. 1A to 1G are schematic cross-sectional views of a fabrication process of a resistive random access memory according to an embodiment of the disclosure.
Figure 1B:
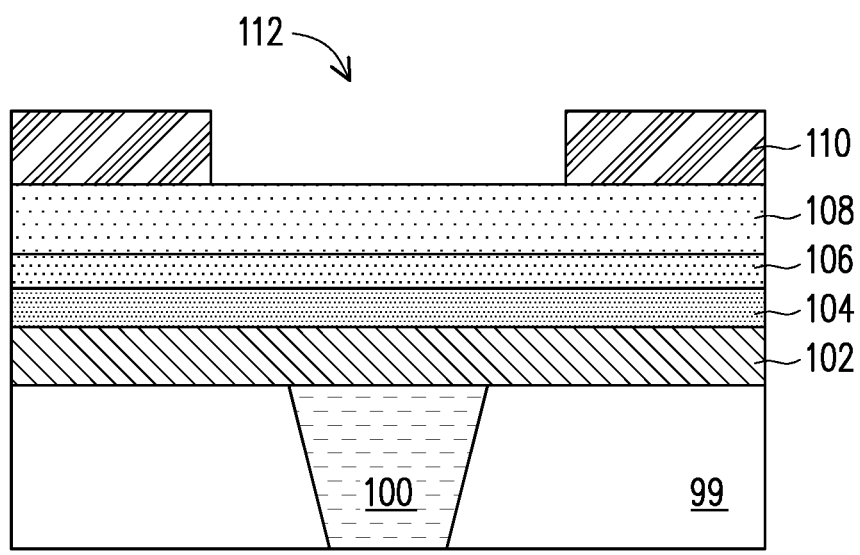
Figure 1C:
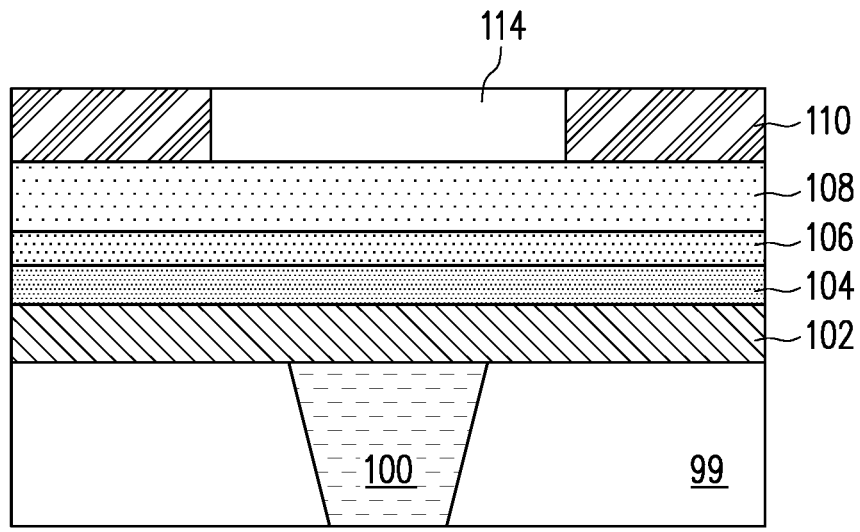
Figure 1D:
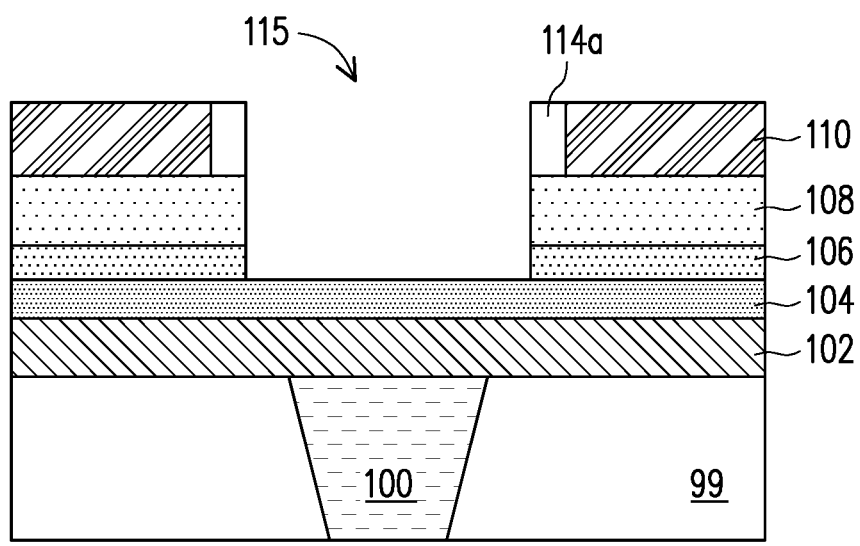
Figure 1E:
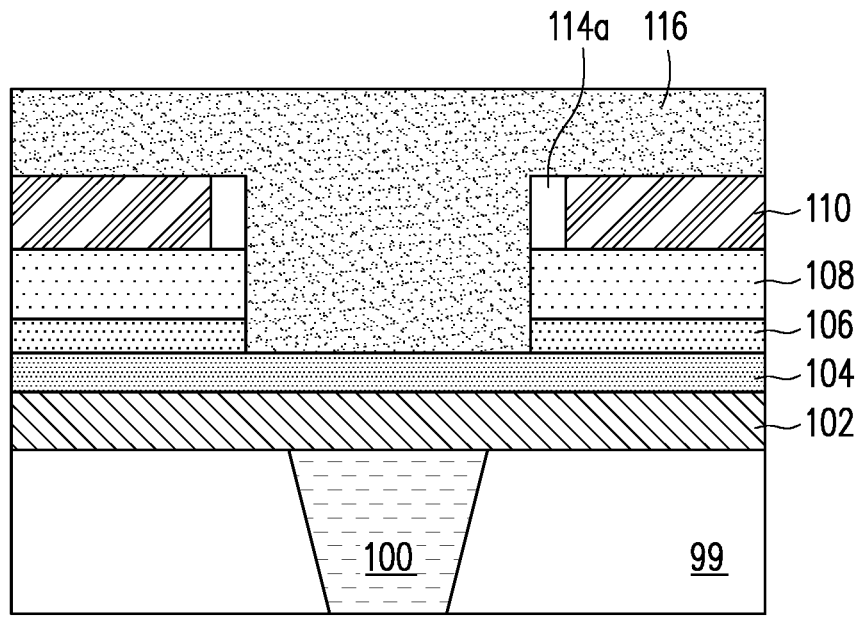
Figure 1F:
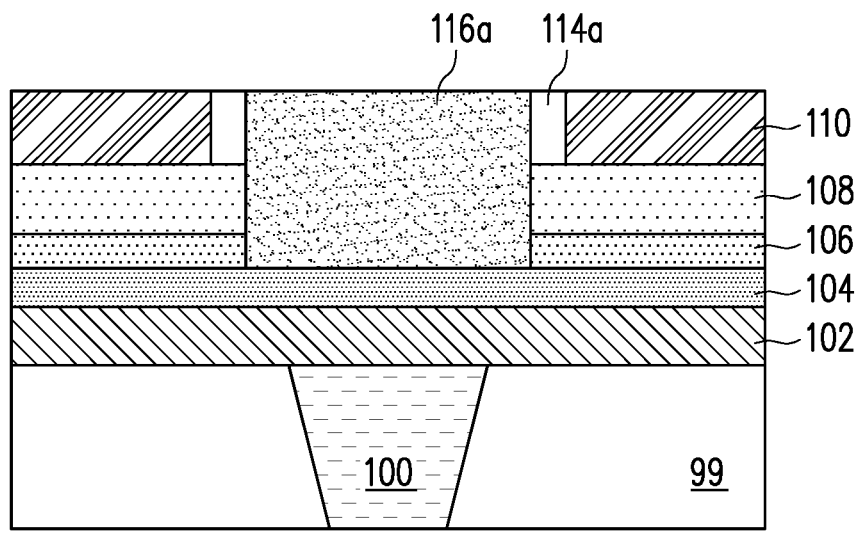
Figure 1G:
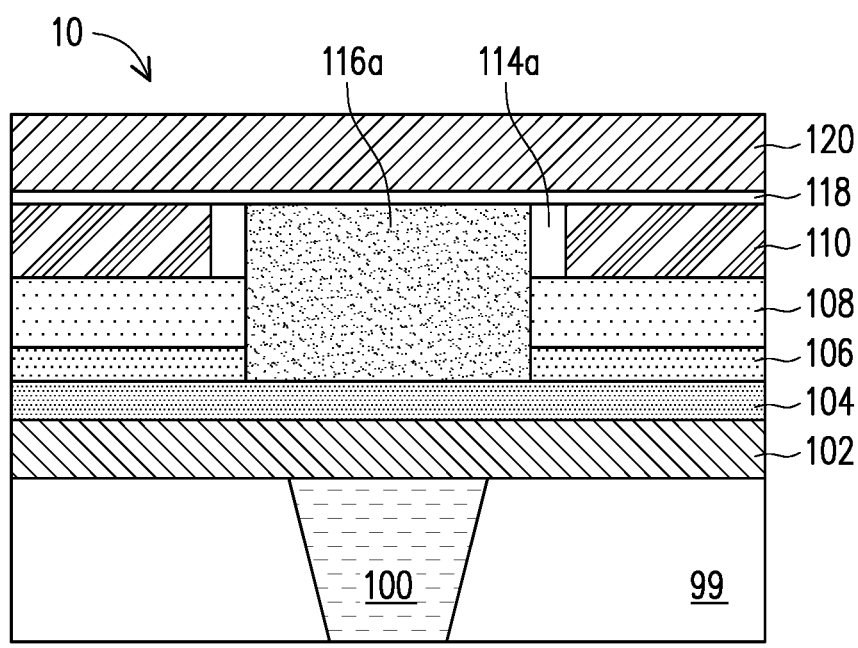

With reference to FIG. 1G, a resistive random access memory (RRAM) unit 10 includes a first electrode 102, a variable resistance layer 104, a second electrode 120, a vacancy-barrier layer 106, a vacancy-supply layer 108, and a vacancy-driving electrode layer 110, an oxygen exchange layer 116a, a first oxygen barrier layer 114a, and a second oxygen barrier layer 118.

The first electrode 102 may be connected to a conductive feature below, such as a via plug 100. The via plug 100 is, for example, any via plug in a dielectric layer 99 of the metal interconnection structure formed on the substrate. The via plug 100 is, for example, a via plug of a same height as a first layer via plug in contact with a first metal layer closest to the substrate.

The first electrode layer 102 and the second electrode 120 are disposed correspondingly. Materials of the first electrode layer 102 and the second electrode 120 may include metal, metal nitride, other materials, or a combination thereof. The materials of the first electrode layer 102 and the second electrode 120 are, for example, titanium nitride (TiN), tantalum nitride (TaN), titanium aluminum nitride (TiAlN), titanium tungsten (TiW) alloy, platinum (Pt), iridium (Ir), ruthenium (Ru), titanium (Ti), tungsten (W), tantalum (Ta), aluminum (Al), zirconium (Zr), hafnium (Hf), nickel (Ni), copper (Cu), cobalt (Co), iron (Fe), gamma (Gd), manganese (Mo), graphite, or a combination thereof. The first electrode layer 102 and the second electrode 120 may be a single layer or multiple layers. Thicknesses of the first electrode layer 102 and the second electrode 120 are not specifically limited, but is usually between 5 nanometers (nm) and 500 nm.

The variable resistance layer 104 is located between the first electrode layer 102 and the second electrode 120. The variable resistance layer 104 may have the following characteristics. Oxygen ions are attracted by a positive voltage away from the variable resistance layer 104 to generate oxygen vacancies, form filaments, and present a conductive state when the positive voltage is applied to the resistive random access memory. At this time, the variable resistance layer 104 converts from a high resistance state (HRS) to a low resistance state (LRS). The oxygen ions enter the variable resistance layer 104, causing the filaments to break and presenting a non-conductive state when a negative bias is applied to the resistive random access memory. At this time, the variable resistance layer 104 converts from LRS to HRS. In general, the conversion of the variable resistance layer 104 from FIRS to LRS is called a set (hereinafter referred to as SET) operation and the conversion of the variable resistance layer 104 from LRS to FIRS is called a reset (hereinafter referred to as RESET) operation. A material of the variable resistance layer 104 is not specifically limited, and any material that may change its own resistance through application of a voltage may be used, the material of the variable resistance layer 104 includes metal oxides, such as hafnium oxide ($HfO_2$), tantalum oxide ($Ta_2O_5$), titanium oxide ($TiO_2$), magnesium oxide (MgO), nickel oxide (NiO), niobium oxide ($Nb_2O_5$), aluminum oxide ($Al_2O_3$), vanadium oxide ($V_2O_5$), tungsten oxide ($WO_3$), zinc oxide (ZnO), or cobalt oxide (CoO), oxygen content of the variable resistance layer 104 may be about 75 atomic percent (at %) to about 100 atomic percent. A thickness of the variable resistance layer 104 is, for example, 2 nm to 10 nm.

The oxygen exchange layer 116a is located between the variable resistance layer 104 and the second electrode 120. A top surface area of the oxygen exchange layer 116a is less than a surface bottom area of the second electrode 120, and a surface bottom area of the oxygen exchange layer 116a is less than a top surface area of the variable resistance layer 104. The oxygen exchange layer 116a may be formed from a material likely to bond with oxygen than the vacancy-driving electrode layer 110 and the variable resistance layer 104. The material of the oxygen exchange layer 116a may include an incompletely oxidized metal oxide. In other words, the oxygen exchange layer 116a may be a metal layer containing oxygen ions, the material of the oxygen exchange layer 116a may include $TiO_{2-x}$, $HfO_{2-x}$, or $TaO_{2-x}$, where x is 0.2 to 0.7.

The first oxygen barrier layer 114a and the second oxygen barrier layer 118 surround the top surface and an upper sidewall of the oxygen exchange layer 116a. The first oxygen barrier layer 114a laterally surrounds the upper sidewall of the oxygen exchange layer 116a, and is located between the second oxygen barrier layer 118 and the vacancy-supply layer 108, and between the upper sidewall of the oxygen exchange layer 116a and the vacancy-driving electrode layer 110. The second oxygen barrier layer 118 covers the top surface of the oxygen exchange layer 116a, a top surface of the first oxygen barrier layer 114a, and a top surface of the vacancy-driving electrode layer 110, the first oxygen barrier layer 114a and the second oxygen barrier layer 118 may block oxygen ions in the oxygen exchange layer 116a from diffusing to the second electrode 120 and the vacancy-driving electrode layer 110 when the RRAM unit 10 is performing the RESET operation. The first oxygen barrier layer 114a and the second oxygen barrier layer 118 may include a dielectric material layer with a high dielectric constant greater than 3, such as aluminum oxide ($Al_2O_3$), hafnium oxide ($HfO_2$), or zirconium oxide ($ZrO_2$), or a combination thereof.

The vacancy-supply layer 108 laterally surrounds a middle sidewall of the oxygen exchange layer 116a, which may provide vacancies to the oxygen exchange layer 116a. A material of the vacancy-supply layer 108 may include an incompletely oxidized metal oxide. In other words, the vacancy-supply layer 108 may be a metal layer containing oxygen ions. The material of the vacancy-supply layer 108 may include $TiO_x$, $TaO_x$, $HfO_x$, $Ta_2O_{5-x}$, or $TaO_{2-x}$, where x is 0.2 to 1.8. A thickness of the vacancy-supply layer 108 is, for example, 5 nm to 50 nm.

The vacancy-driving electrode layer 110 is located above the vacancy-supply layer 108 and below the second electrode 120. The vacancy-driving electrode layer 110 laterally surrounds the upper sidewall of the oxygen exchange layer 116a, and the first oxygen barrier layer 114a is sandwiched between the vacancy-driving electrode layer 110 and the upper sidewall of the oxygen exchange layer 116a. The vacancy-driving electrode layer 110 may drive vacancies in the vacancy-supply layer 108 below to enter the oxygen exchange layer 116a through the middle sidewall of the oxygen exchange layer 116a. The vacancy-driving electrode layer 110 is less likely to bond with oxygen as compared with the oxygen exchange layer 116a and the vacancy-supply layer 108. The vacancy-driving electrode layer 110 may also be called an inert vacancy-driving electrode layer 110. The vacancy-driving electrode layer 110 may be a single layer or multiple layers. The vacancy-driving electrode layer 110 includes a conductive material. The conductive material may be a metal or a metal nitride, such as platinum, iridium, ruthenium, rhodium, tungsten, titanium, hafnium, tantalum, hafnium nitride, tantalum nitride, titanium nitride, tungsten nitride, or a combination thereof, the top surface of the vacancy-driving electrode layer 110 is coplanar with the top surface of the first oxygen barrier layer 114a and the top surface of the oxygen exchange layer 116a. A bottom surface of the vacancy-driving electrode layer 110 is coplanar with a bottom surface of the first oxygen barrier layer 114a. A thickness of the vacancy-driving electrode layer 110 is, for example, 10 nm to 100 nm.

The vacancy-barrier layer 106 is located below the vacancy-supply layer 108 and above the variable resistance layer 104, and laterally surrounds a lower sidewall of the oxygen exchange layer 116a. The vacancy-barrier layer 106 may prevent the vacancies in the vacancy-supply layer 108 from diffusing downward, and limit a path of the vacancies in the vacancy-supply layer 108. The path of the vacancies of the vacancy-supply layer 108 is to enter the oxygen exchange layer 116a through the middle sidewall of the oxygen exchange layer 116a, and then travel down to the variable resistance layer 104. A material of the vacancy-barrier layer 106 includes a dielectric material. A dielectric constant of the vacancy-barrier layer 106 is greater than 4 and less than dielectric constants of the first oxygen barrier layer 114a and the second oxygen barrier layer 118. The dielectric material is, for example, a dielectric material containing silicon. The silicon-containing dielectric material is, for example, silicon nitride, silicon carbide, silicon carbonitride (SiCN), silicon carbon oxynitride (SiCON), or a combination thereof.

A positive voltage is applied to the second electrode 120 to enable the oxygen ions in the variable resistance layer 104 to enter the oxygen exchange layer 116a after being attracted by the positive voltage to leave the variable resistance layer 104, and generate oxygen vacancies in the resistance layer 104 generates to form a filament current when the RRAM unit 10 is performing a forming operation. In addition, the vacancy-driving electrode layer 110 also drives the vacancies in the vacancy-supply layer 108 below to enter the oxygen exchange layer 116a through the middle sidewall of the oxygen exchange layer 116a, and then travels down to the variable resistance layer 104 to form an additional filament current when the positive voltage is applied to the second electrode 120. In other words, a current of the RRAM unit 10 not only comes from the vacancies formed by the oxygen ions leaving the variable resistance layer 104, but also from the vacancies in the vacancy-supply layer 108. Therefore, the RRAM unit 10 has sufficient current.

With reference to FIGS. 1A to 1G a method of fabricating the RRAM unit 10 is described as follows.

With reference to FIG. 1A, the first electrode layer 102, the variable resistance layer 104, the vacancy-barrier layer 106, the vacancy-supply layer 108, and the vacancy-driving electrode layer 110 are sequentially formed on a substrate (not shown) on which the via plug 100 and the dielectric layer 99 have been formed.

With reference to FIG. 1B, photolithography and an etching process is performed to pattern the vacancy-driving electrode layer 110, and then an opening 112 is formed in the vacancy-driving electrode layer 110. A bottom surface of the opening 112 exposes the vacancy-supply layer 108.

With reference to FIG. 1C, the first oxygen barrier layer 114 is formed in the opening 112. A formation method of the first oxygen barrier layer 114 is, for example, forming a first oxygen barrier material layer on the vacancy-driving electrode layer 110 and in the opening 112, and then performing a planarization process to remove the first oxygen barrier material layer except for the first oxygen barrier material layer in the opening 112.

With reference to FIG. 1D, an opening 115 is formed in the first oxygen barrier layer 114, the vacancy-supply layer 108, and the vacancy-barrier layer 106, and a first oxygen barrier layer 114a is left behind on an upper sidewall of the opening 115. The opening 115 may be formed by photolithography and etching, so as to pattern the first oxygen barrier layer 114, the vacancy-supply layer 108, and the vacancy-barrier layer 106. The opening 115 may also be formed by the following method. An anisotropic etching process is performed on the first oxygen barrier layer 114 to form an oxygen barrier spacing wall, that is, the first oxygen barrier layer 114a. Afterwards, an etching process is performed by using the oxygen barrier spacing wall (the first oxygen barrier layer 114a) and the vacancy-driving electrode layer 110 as a hard mask, so as to remove a portion of the vacancy-supply layer 108 and a portion of the vacancy-barrier layer 10 to form the opening 115.

With reference to FIGS. 1E and 1F, the oxygen exchange layer 116 is formed on the vacancy-driving electrode layer 110 and the first oxygen barrier layer 114a, and in the opening 115. Then, a planarization process is performed to remove the oxygen exchange layer 116 except for the oxygen exchange layer 116 in the opening 115, leaving behind the oxygen exchange layer 116 in the opening 115, and exposing the vacancy-driving electrode layer 110 and the first oxygen barrier layer 114a.

With reference to FIG. 1G the second oxygen barrier layer 118 and the second electrode layer 120 are formed on the vacancy-driving electrode layer 110 and the first oxygen barrier layer 114a. Afterwards, the second electrode layer 120, the second oxygen barrier layer 118, the vacancy-driving electrode layer 110, the vacancy-supply layer 108, the vacancy-barrier layer 106, the variable resistance layer 104, and the first electrode layer 102 are patterned to form the resistive random access memory unit 10.

In the resistive random access memory and the method of fabricating the same according to the embodiment of the disclosure, the vacancies of the variable resistance layer may be increased by the disposition of the vacancy-driving electrode layer and the vacancy-supply layer, thereby increasing the current of the resistive random access memory and prevent an excessively large operating voltage being used, so as to reduce power consumption. In addition, since the resistive random access memory has a high current in the initial stage, even if some of the filaments are damaged in the subsequent baking process, the resistive random access memory can still have enough current during operation.

Although the disclosure has been disclosed with the foregoing exemplary embodiments, they are not intended to limit the disclosure. Any person skilled in the art can make various changes and modifications within the spirit and scope of the disclosure. Accordingly, the scope of the disclosure is defined by the claims appended hereto and their equivalents.

What is claimed is:

1. A resistive random access memory, comprising:
    a first electrode layer and a second electrode layer, disposed opposite to each other;
    a variable resistance layer located between the first electrode layer and the second electrode layer;
    an oxygen exchange layer located between the variable resistance layer and the second electrode layer;
    a vacancy-supply layer, surrounding a middle sidewall of the oxygen exchange layer; and
    a vacancy-driving electrode layer, located on the vacancy-supply layer and surrounding an upper sidewall of the oxygen exchange layer.

2. The resistive random access memory according to claim 1, wherein a material of the vacancy-supply layer comprises $TiO_x$, $TaO_x$, $HfO_x$, $Ta_2O_{5-x}$ or $TaO_{2-x}$, where x is 0.2 to 1.8.

3. The resistive random access memory according to claim 1, wherein a material of the vacancy-driving electrode layer comprises platinum, iridium, ruthenium, rhodium, tungsten, titanium, hafnium, tantalum, hafnium nitride, tantalum nitride, titanium nitride, tungsten nitride, or a combination thereof.

4. The resistive random access memory according to claim 1, further comprising:
    a vacancy-barrier layer, located between the variable resistance layer and the vacancy-supply layer, and surrounding a bottom sidewall of the oxygen exchange layer.

5. The resistive random access memory according to claim 1, further comprising:
    a first oxygen barrier layer, located between the upper sidewall of the oxygen exchange layer and the vacancy-driving electrode layer; and
    a second oxygen barrier layer, located between the second electrode layer and the vacancy-driving electrode layer, and between the second electrode layer and the oxygen exchange layer.

6. A method of fabricating a resistive random access memory, comprising:
    forming a variable resistance layer on a first electrode layer;
    forming a vacancy-supply layer on the variable resistance layer;
    forming a vacancy-driving electrode layer on the vacancy-supply layer;

forming a first opening in the vacancy-driving electrode layer;
forming a first oxygen barrier layer in the first opening;
forming a second opening in the first oxygen barrier layer and the vacancy-supply layer;
forming an oxygen exchange layer in the second opening;
forming a second oxygen barrier layer on the vacancy-driving electrode layer and the oxygen exchange layer; and
forming a second electrode layer on the second oxygen barrier layer.

7. The method of fabricating the resistive random access memory according to claim 6, wherein a material of the vacancy-supply layer comprises $TiO_x$, $TaO_x$, $HfO_x$, $Ta_2O_{5-x}$ or $TaO_{2-x}$, where x is 0.2 to 1.8.

8. The method of fabricating the resistive random access memory according to claim 6, wherein a material of the vacancy-driving electrode layer comprises platinum, iridium, ruthenium, rhodium, tungsten, titanium, hafnium, tantalum, hafnium nitride, tantalum nitride, titanium nitride, tungsten nitride, or a combination thereof.

9. The method of fabricating the resistive random access memory according to claim 6, further comprising:

forming a vacancy-barrier layer on the variable resistance layer before the vacancy-supply layer is formed on the variable resistance layer.

10. The method of fabricating the resistive random access memory according to claim 6, wherein formation of the second opening in the first oxygen barrier layer, the vacancy-supply layer, and the vacancy-barrier layer comprises:

performing photolithography and an etching process to pattern the first oxygen barrier layer, the vacancy-supply layer and the vacancy-barrier layer.

11. The method of fabricating the resistive random access memory according to claim 6, formation of the second opening in the first oxygen barrier layer, the vacancy-supply layer, and the vacancy-barrier layer comprises:

performing an anisotropic etching process on the first oxygen barrier layer to form an oxygen barrier spacing wall; and performing an etching process by using the oxygen barrier spacing wall and the vacancy-driving electrode layer as a hard mask, so as to remove a portion of the vacancy-supply layer and a portion of the vacancy-barrier layer.

* * * * *